(12) United States Patent
Kim et al.

(10) Patent No.: US 7,205,033 B2
(45) Date of Patent: Apr. 17, 2007

(54) METHOD FOR FORMING POLYCRYSTALLINE SILICON FILM OF POLYCRYSTALLINE SILICON TFT

(75) Inventors: Eok Su Kim, Seoul (KR); Ho Nyeon Lee, Kyoungki-do (KR); Myung Kwan Ryu, Kyoungki-do (KR); Jae Chul Park, Seoul (KR); Kyoung Seok Son, Seoul (KR); Jun Ho Lee, Kyoungki-do (KR); Se Yeoul Kwon, Seoul (KR)

(73) Assignee: Boe Hydis Technology Co., Ltd., Kyoungki-do (KR)

( * ) Notice: Subject to any disclaimer, the term of this patent is extended or adjusted under 35 U.S.C. 154(b) by 214 days.

(21) Appl. No.: 10/934,826

(22) Filed: Sep. 3, 2004

(65) Prior Publication Data

US 2005/0142299 A1 Jun. 30, 2005

(30) Foreign Application Priority Data

Dec. 29, 2003 (KR) .................. 10-2003-0098756

(51) Int. Cl.
| | |
|---|---|
| *B05D 3/06* | (2006.01) |
| *C23C 16/04* | (2006.01) |
| *H01L 21/20* | (2006.01) |
| *H01L 21/027* | (2006.01) |
| *H01L 27/12* | (2006.01) |
| *H01L 31/0392* | (2006.01) |

(52) U.S. Cl. .................. 427/555; 427/532; 427/553; 427/554; 427/272; 118/720; 118/721; 438/795; 438/796; 257/351

(58) Field of Classification Search ........... 427/272, 427/553–555, 532; 118/720, 721; 438/795, 438/796; 257/351
See application file for complete search history.

(56) References Cited

U.S. PATENT DOCUMENTS

| 6,117,752 A | * | 9/2000 | Suzuki ................ 438/487 |
| 6,555,449 B1 | * | 4/2003 | Im et al. ............. 438/487 |
| 2004/0084679 A1 | * | 5/2004 | Nakayama ............ 257/75 |

FOREIGN PATENT DOCUMENTS

| KR | 2000 0001170 | 1/2000 |
| KR | 2002 0091896 | 12/2002 |

* cited by examiner

*Primary Examiner*—Timothy Meeks
*Assistant Examiner*—Cachet I Sellman
(74) *Attorney, Agent, or Firm*—Ladas & Parry LLP

(57) ABSTRACT

Disclosed is a method for forming a polycrystalline silicon film of a polycrystalline silicon thin film transistor. The method includes a step of crystallizing an amorphous silicon film deposited on a glass substrate by irradiating a laser beam onto the amorphous silicon film using a mask pattern. The glass substrate is horizontally moved by a predetermined distance unit corresponding to a translation distance of the mask pattern when the laser beam is irradiated onto the amorphous silicon film through a mask having the mask pattern, thereby growing grains in a circular shape.

4 Claims, 4 Drawing Sheets

Poly-Si Grain growth direction
(electrical characteristic good)

vertical direction to grain growth
(electrical characteristic bad)

METHOD FOR FORMING POLYCRYSTALLINE SILICON FILM OF POLYCRYSTALLINE SILICON TFT

BACKGROUND OF THE INVENTION

1. Field of the Invention

The present invention relates to a method for fabricating a liquid crystal display device, and more particularly to a method for forming a polycrystalline silicon film in order to fabricate a polycrystalline silicon thin film transistor.

2. Description of the Prior Art

A thin film transistor (hereinafter, simply referred to as "TFT") used as a switching device in a liquid crystal display device or an organic light emitting display is a main component for improving performance of such flat panel display devices. Herein, mobility or current leakage, which is a basic factor determining performance of the TFT, varies depending on a state of an active layer providing a route for a charge carrier. That is, such mobility or current leakage may vary depending on a state or a structure of a silicon thin film forming the active layer. In currently available liquid crystal display devices, the active layer of the TFT is made from amorphous silicon (hereinafter, simply referred to as a-Si).

However, an a-Si TFT including a-Si as an active layer has low mobility of about 0.5 $cm^2/Vs$, so problems may occur if all switching devices of the liquid crystal display device are fabricated using an a-Si TFT. That is, a driving device for a peripheral circuit of the liquid crystal display device must be operated with a high speed, but the a-Si TFT cannot satisfy the operational speed required by the peripheral circuit of the liquid crystal display, so a problem may occur if the driving device for the peripheral circuit is fabricated by using the a-Si TFT.

Meanwhile, a poly-Si TFT including polycrystalline silicon (hereinafter, simply referred to as poly-Si) as an active layer has high mobility of about tens of or hundreds of $cm^2/Vs$. Thus, the poly-Si TFT can satisfy the high operational speed required by the peripheral circuit of the liquid crystal display. Therefore, it is possible to achieve a pixel switching device as well as driving parts for the peripheral circuit by forming the poly-Si TFT on a glass substrate. Accordingly, a module process for the peripheral circuit is not required and costs for the driving parts of the peripheral circuit can be saved because the driving parts of the peripheral circuit can be simultaneously formed when forming a pixel region.

In addition, the poly-Si TFT can be fabricated with a small size as compared with the a-Si TFT due to high mobility of the poly-Si TFT. Furthermore, since the driving device of the peripheral circuit and the switching device of the pixel region can be simultaneously formed through an integration process, a micro design rule can be easily achieved so that an a-Si TFT-LCD can provide an image having high resolution.

Moreover, since the poly-Si TFT has a superior current characteristic, the poly-Si TFT is adaptable for a driving device of an organic light emitting display, which is a next-generation flat panel display device. Thus, studies and research regarding the poly-Si TFT have been actively carried out to fabricate the poly-Si TFT by forming a poly-Si film on a glass substrate.

In order to form such a poly-Si film on the glass substrate, an a-Si film is deposited on the glass substrate and a heat-treatment process is carried out with respect to the a-Si film, thereby crystallizing the a-Si film. However, in this case, the glass substrate may be deformed if a process temperature exceeds 600° C., thereby lowering reliability and productivity.

Thus, an excimer laser annealing process has been suggested in order to crystallize the a-Si film without causing a terminal damage to the glass substrate. In addition, a sequential lateral solidification (hereinafter, simply referred to as "SLS") method has been suggested.

According to the SLS method, poly-Si is formed by crystallizing a-Si using a pulse layer and a mask having a slit pattern providing a transmission route for a pulse laser beam. In this case, a crystallization status of poly-Si may vary depending on a shape of the mask and a proceeding route of the laser beam.

According to the SLS method, a seed poly-Si film is firstly formed and a next poly-Si film is grown based on the seed poly-Si film through a directional process, a 2-shot process, a 3-shot process, and an n-shot process.

However, as shown in FIG. 1, although the SLS method may enlarge the size of grains in a growing direction of the grains, a plurality of grain boundaries are formed in a direction vertical to the growing direction of the grains. Thus, the SLS method may represent a superior electric characteristic in the growing direction of the grains, while representing an inferior electric characteristic in the direction vertical to the growing direction of the grains.

That is, when forming a TFT on an uneven poly-Si film formed through the SLS method by using the directional process, the 2-shot process, or the n-shot process, differential mobility may be represented in the TFT if the TFT has channels aligned in the growing direction of the grains and aligned in the direction vertical to the growing direction of the grains. Thus, performance of the TFT is unevenly represented, causing a bad influence on performance of an article.

SUMMARY OF THE INVENTION

Accordingly, the present invention has been made to solve the above-mentioned problems occurring in the prior art, and an object of the present invention is to provide a method for forming a poly-Si film of a poly-Si TFT, capable of preventing performance of a TFT from being deteriorated due to the growing direction of grains.

In order to accomplish the object, there is provided a method for forming a polycrystalline silicon film of a polycrystalline silicon thin film transistor, the method comprising a step of crystallizing an amorphous silicon film deposited on a glass substrate by irradiating a laser beam onto the amorphous silicon film using a mask pattern, wherein the glass substrate is horizontally moved by a predetermined distance unit corresponding to a translation distance of the mask pattern when the laser beam is irradiated onto the amorphous silicon film through a mask having the mask pattern, thereby growing grains in a circular shape.

According to the preferred embodiment of the present invention, the mask pattern is divided into three regions having lengths identical to each other, each region includes a plurality of hexagonal unit cells having six triangle areas, two opposite triangle areas of each hexagonal unit cell provide a transmission section, remaining four triangle areas of each hexagonal unit cell provide a non-transmission section, and positions of transmission sections formed in one region are different from positions of transmission sections formed in other regions.

The glass substrate is horizontally moved by a predetermined distance corresponding to a width of each region formed in the mask pattern. In addition, the laser irradiation process is carried out with energy sufficient for completely melting the amorphous silicon film by using a pulse duration extender in such a manner that pulse duration time may increase.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, preferred embodiments of the present invention will be described with reference to accompanying drawings.

According to a technical principle of the present invention, a-Si is crystallized through an SLS method in order to form poly-Si. At this time, the grains are formed in a circular shape by varying a shape of a mask pattern.

In this case, the grains may be grown without forming a specific growing direction, so that uneven performance of a TFT caused by differential mobility of the TFT between a grain growing direction and a direction vertical to the grain growing direction can be prevented. Thus, performance of the poly-Si TFT and a liquid crystal display device can be improved.

Hereinafter, the method for forming the poly-Si film by using the SLS method according to the present invention will be described in detail with reference to FIGS. 2 to 4.

Figure 1:
FIG. 1 is a photographic view showing a microstructure of a poly-Si film grown according to a conventional SLS method.
Figure 1:
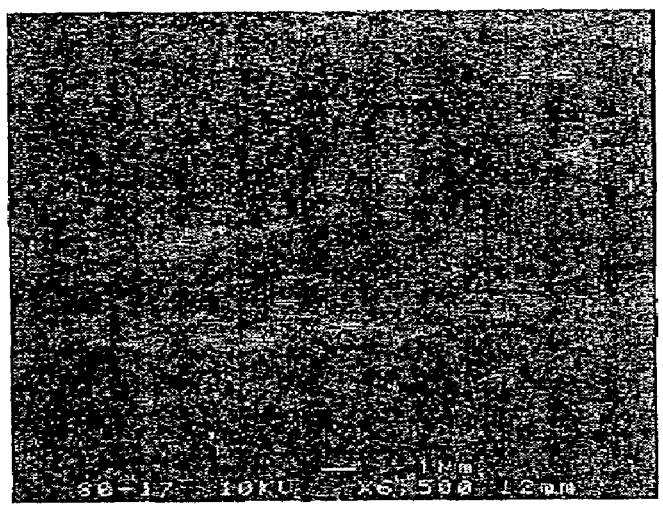
Figure 1:
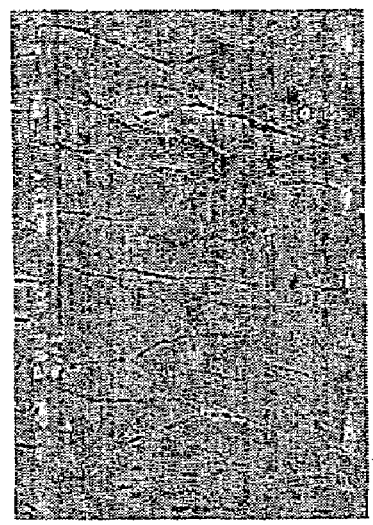
Figure 2:
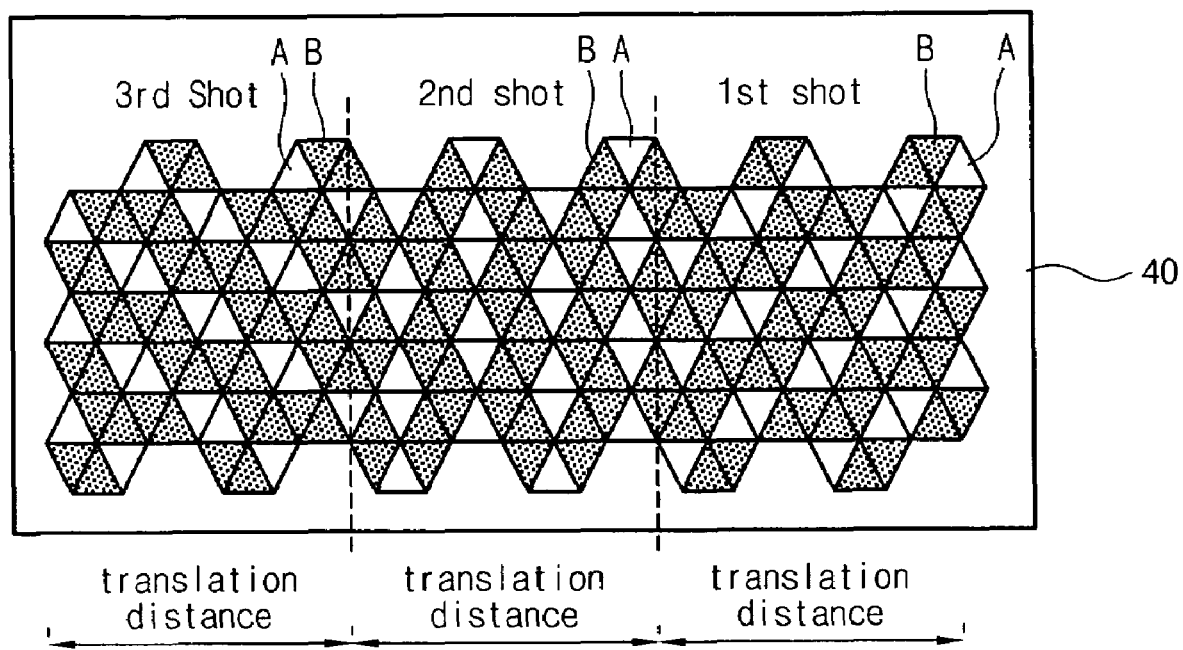
FIG. 2 is a view showing a mask pattern used in a method for forming a poly-Si film according to one embodiment of the present invention.
Figure 3:
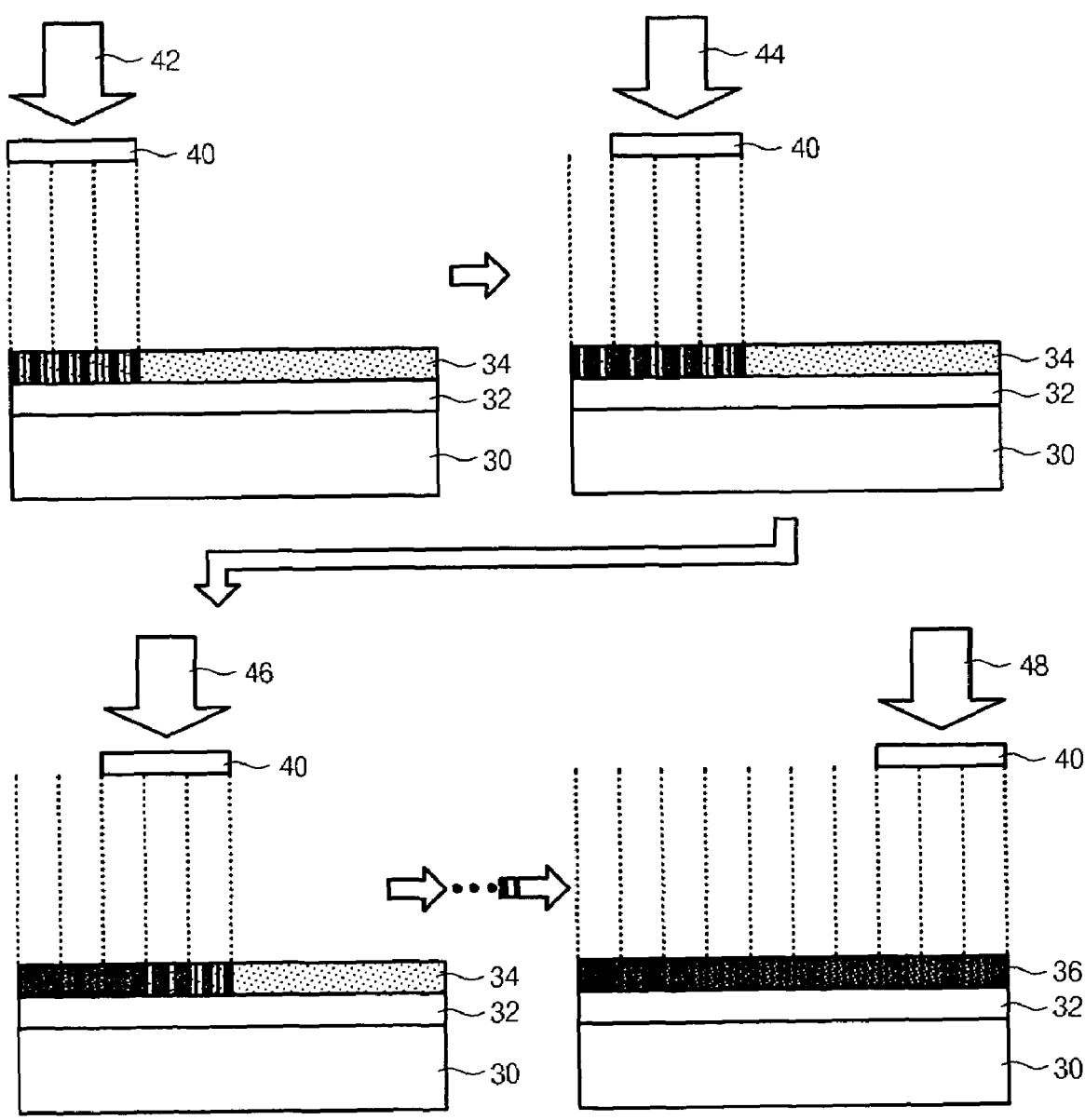
FIG. 3 is a view for explaining a method for forming a poly-Si film according to one embodiment of the present invention.
Figure 4:
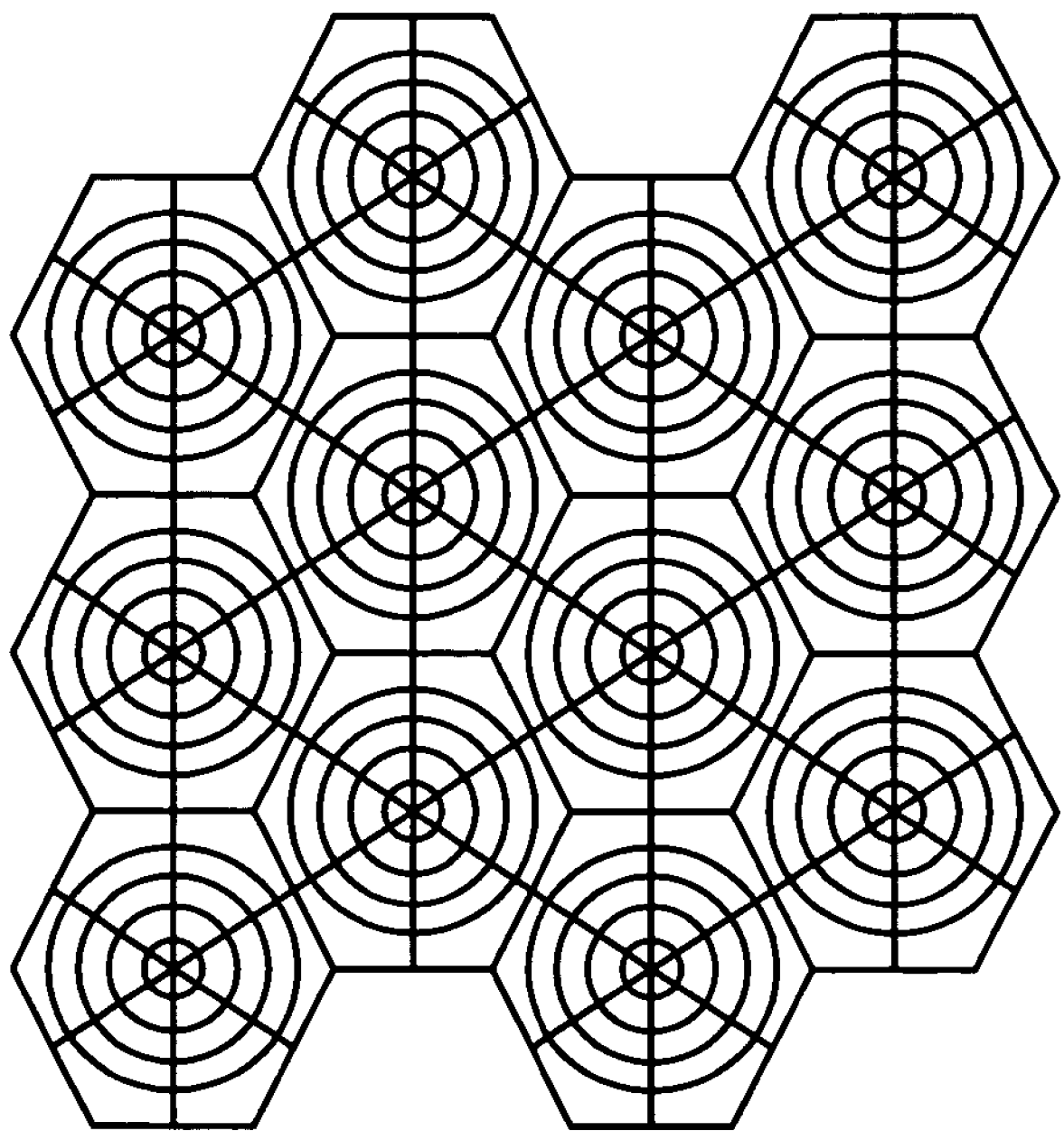
FIG. 4 is a view showing a microstructure of a poly-Si film formed through a method according to one embodiment of the present invention.

Herein, FIG. 2 is a view showing a mask pattern used in a method for forming a poly-Si film according to one embodiment of the present invention, FIG. 3 is a view for explaining the method for forming the poly-Si film according to one embodiment of the present invention, and FIG. 4 is a view showing a microstructure of the poly-Si film formed through the method according to one embodiment of the present invention.

Referring to FIG. 2, a mask 40 used in the method for forming the poly-Si film according to one embodiment of the present invention has three regions having predetermined mask patterns, that is, the mask 40 has first to third shot regions. Each of the first to third shot regions includes a plurality of hexagonal unit cells, in which each hexagonal unit cell has six triangle areas.

In the first shot region, each hexagonal unit cell includes two triangle areas facing each other and forming a transmission section A and four triangle areas forming a non-transmission section B. Accordingly, a one-third section of the mask pattern in the first shot region may allow a laser beam to pass therethrough. Similar to the first shot region, each hexagonal unit cell of the second shot region includes two triangle areas facing each other and forming a transmission section A and four triangle areas forming a non-transmission section B. However, a position of the transmission section of the second shot region is different from a position of the transmission section of the first shot region. Accordingly, a one-third section of the mask pattern in the second shot region may allow the laser beam to pass therethrough. Similar to the first and second shot regions, each hexagonal unit cell of the second shot region includes two triangle areas facing each other and forming a transmission section A and four triangle areas forming a non-transmission section B. In addition, a position of the transmission section A of the third shot region is different from positions of the transmission sections A of the first and second shot regions. A length of each shot region corresponds to a translation distance of the mask pattern when performing the SLS process.

Hereinafter, the method for forming the poly-Si film by using the mask 40 according to the present invention will be described with reference to FIG. 3.

Referring to FIG. 3, a buffer layer 32 including an insulation layer having silicon, such as SiOx, SiOxNy, or SiNx, a metal layer containing Al, Cu, Ag, Ti or W, a metal nitride layer or a metal oxide layer is formed on a glass substrate 30. Then, an a-Si film 34 is deposited on the buffer layer. After that, the mask 40 having a mask pattern as shown in FIG. 2 is aligned above the a-Si film 34. In this state, a primary laser irradiation process 42 is carried out with respect to the a-Si film 34 by using a pulse laser beam having energy sufficient for completely melting a-Si of the a-Si film 34.

At this time, the laser beam only passes through the transmission sections A of the first shot region, and predetermined portions of the a-Si film, onto which the laser beam is irradiated, are completely melted. In addition, a temperature of the melted a-Si film becomes lowered as time goes by, so that solidification of a-Si into poly-Si and lateral growth of grains may occur from peripheral portions of triangle areas. In addition, the grains growing from the peripheral portions of triangle areas make contact with each other at a center portion of each triangle area while forming a protrusion. At this time, the lateral growth of poly-Si may stop. Thus, a-Si formed over a one-third section of the a-Si film is crystallized into poly-Si through the above primary laser irradiation process.

Then, the glass substrate 30 is moved corresponding to a translation distance of the mask pattern and a secondary laser irradiation process 44 is carried out. In this case, the laser beam is irradiated onto predetermined portions of the a-Si film, which are not crystallized in the primary irradiation process, through the transmission sections A of the second shot region. Thus, a-Si formed in the predetermined portions of the a-Si film corresponding to the transmission sections A of the second shot region is crystallized into poly-Si. At this time, since the grains are laterally grown based on seed poly-Si, which has been formed through the primary laser irradiation process, the grains are continuously grown in a circular shape. That is, another one-third section of the a-Si film is crystallized through the above secondary laser irradiation process, so that two-third sections of the a-Si film are crystallized through the primary and secondary laser irradiation processes.

After that, the glass substrate 30 is again moved by a predetermined distance corresponding to a translation distance of the mask pattern and a third laser irradiation process 46 is carried out using a pulse laser. At this time, the third laser irradiation process 46 is carried out with respect to predetermined portions of the a-Si film, which are not crystallized through the primary and secondary laser irradiation processes. That is, since a position of each transmission section formed in the third shot region is different from positions of the transmission sections formed in the first and second shot regions, the laser beam is radiated onto predetermined areas of the a-Si film, which are not crystallized through the primary and secondary laser irradiation processes. As a result, the predetermined areas of the a-Si film are completed melted and solidified, so that a-Si formed in the predetermined areas of the a-Si film is crystallized into poly-Si. At this time, since the grains are laterally grown based on seed poly-Si, which has been formed through the primary and secondary laser irradiation processes, the grains are continuously grown in the circular shape. Thus, the predetermined areas of the a-Si film are crystallized through the third laser irradiation process, and a-Si formed in the predetermined areas of the a-Si film is crystallized into poly-Si.

After that, an $n^{th}$ laser irradiation process 48 is carried out using the pulse laser while moving the glass substrate by a predetermined distance corresponding to the translation distance of the mask pattern, thereby crystallizing the whole area of the a-Si film. As a result, it is possible to form a poly-Si film 36.

As shown in FIG. 4, the poly-Si film 36 has grains grown in the circular shape. That is, the grains are grown without forming a specific growing direction, so that it is possible to form a uniform poly-Si film.

Meanwhile, according to another embodiment of the present invention, a plastic substrate can be used instead of the glass substrate. In addition, the laser irradiation processes are preferably carried out by using a pulse duration extender such that pulse duration time can be increased. Furthermore, the method of the present invention can be used not only for crystallizing the a-Si film, but also for crystallizing a-Ge, a-SixGey, a-Ga, a-GaNx or a-GaxAsy. Moreover, the method of the present invention can be used for crystallizing multi-crystalline layers. In addition, when performing the laser irradiation processes, the glass substrate or the plastic substrate can move in front and rear directions thereof.

As described above, according to the present invention, a-Si is crystallized into poly-Si through an SLS method by varying a shape of a mask pattern in such a manner that the grains are grown in a circular shape without forming a specific growing direction. Thus, differential mobility of the TFT may not be represented between the growing direction of the grains and the direction vertical to the growing direction of the grains. Thus, performance of the TFT is evenly represented, thereby improving performance of a poly-Si TFT and an article equipped with the poly-Si TFT.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for forming a polycrystalline silicon film of a polycrystalline silicon thin film transistor, the method comprising
    a step of crystallizing an amorphous silicon film deposited on a glass substrate by irradiating a laser beam onto the amorphous silicon film using a mask pattern,
        wherein the glass substrate is horizontally moved by a predetermined distance unit corresponding to a translation distance of the mask pattern when the laser beam is irradiated onto the amorphous silicon film through a mask having the mask pattern, thereby growing grains in a circular shape, and
        wherein the mask pattern is divided into three regions having lengths identical to each other, each region includes a plurality of hexagonal unit cells having six triangle areas, two opposite triangle areas of each hexagonal unit cell provide a transmission section, remaining four triangle areas of each hexagonal unit cell provide a non-transmission section, and positions of transmission sections formed in one region are different from positions of transmission sections formed in other regions.

2. The method as claimed in claim 1, wherein the glass substrate is horizontally moved by a predetermined distance corresponding to a width of each region formed in the mask pattern.

3. The method as claimed in claim 1, wherein the laser irradiation process is carried out with energy sufficient for completely melting the amorphous silicon film.

4. The method as claimed in claim 1, wherein the laser irradiation process is carried out by using a pulse duration extender in such a manner that pulse duration time is increased.

* * * * *